(12) United States Patent
Kawata (10) Patent No.: US 9,356,084 B2
(45) Date of Patent: May 31, 2016

(54) DISPLAY DEVICE AND METHOD OF MANUFACTURING THE SAME

(71) Applicant: Japan Display Inc., Minato-ku (JP)

(72) Inventor: Yasushi Kawata, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/285,705

(22) Filed: May 23, 2014

(65) Prior Publication Data

US 2014/0353637 A1    Dec. 4, 2014

(30) Foreign Application Priority Data

May 31, 2013   (JP) .................................. 2013-116373

(51) Int. Cl.
*H01L 27/32*     (2006.01)
*H01L 51/00*     (2006.01)

(52) U.S. Cl.
CPC ........ *H01L 27/3272* (2013.01); *H01L 27/3244* (2013.01); *H01L 51/003* (2013.01); *H01L 51/0097* (2013.01); *H01L 2227/326* (2013.01)

(58) Field of Classification Search
CPC .............. H01L 51/003; H01L 51/0097; H01L 2227/326
See application file for complete search history.

(56) References Cited

U.S. PATENT DOCUMENTS

| 8,610,124 B2* | 12/2013 | Ro et al. ........................... 257/59 |
| 2007/0254456 A1* | 11/2007 | Maruyama et al. ........... 438/458 |
| 2010/0026952 A1* | 2/2010 | Miura ............... G02F 1/133305 349/150 |
| 2010/0171708 A1 | 7/2010 | Chuang |
| 2011/0255034 A1* | 10/2011 | Nakano et al. .................. 349/84 |
| 2013/0207933 A1* | 8/2013 | Mamba et al. ................ 345/174 |
| 2014/0093988 A1 | 4/2014 | Kawata |
| 2014/0190621 A1 | 7/2014 | Kawata et al. |
| 2015/0153594 A1* | 6/2015 | Sato .................... G02F 1/13452 349/122 |

FOREIGN PATENT DOCUMENTS

| JP | 2008-233799 | 10/2008 |
| JP | 2010-160775 | 7/2010 |
| JP | 2011-221404 | 11/2011 |

* cited by examiner

*Primary Examiner* — Bryan Junge
(74) *Attorney, Agent, or Firm* — Oblon, McClelland, Maier & Neustadt, L.L.P.

(57) ABSTRACT

According to one embodiment, a method of manufacturing a display device, includes preparing a first substrate formed such that a first resin layer is formed on a first support substrate, and thereafter a display element portion and a mounting portion are formed above the first resin layer and a protection layer, which extends from an end portion of the first resin layer along the mounting portion onto the first support substrate, is disposed, preparing a second substrate formed such that a second resin layer is formed on a second support substrate, attaching the first substrate and the second substrate, and mounting a flexible printed circuit board, which is in a state in which the flexible printed circuit board is opposed to the protection layer, on the mounting portion.

10 Claims, 9 Drawing Sheets

DISPLAY DEVICE AND METHOD OF MANUFACTURING THE SAME

CROSS-REFERENCE TO RELATED APPLICATIONS

This application is based upon and claims the benefit of priority from Japanese Patent Application No. 2013-116373, filed May 31, 2013, the entire contents of which are incorporated herein by reference.

FIELD

Embodiments described herein relate generally to a display device and a method of manufacturing the display device.

BACKGROUND

Flat-panel display devices, such as an organic electroluminescence (EL) display device and a liquid crystal display device, have been used in various fields. In recent years, as regards mobile information terminal devices such as mobile phones and PDAs (personal digital assistants), there has been an increasing demand for a display device having a less thickness and a less weight.

For example, such a technique has been proposed that all members constituting an electronic device are configured to be flexible by connecting a flexible display panel and a flexible driving circuit board via a flexible printed circuit. As another similar example, there has been proposed a technique in which a flexible printed circuit is connected to a flexible display panel. In addition, as another example, such a technique has been proposed that a flexible display panel module is sandwiched between two resin sheets, these two resin sheets are thermocompression-bonded, and a flexible printed circuit board, which is connected to an end portion of the display panel module, is also sandwiched between the two resin sheets, thereby enhancing sealing properties and ensuring protection against the external environment.

On the other hand, there has been a demand for simplifying a manufacturing process and improving productivity in achieving mass-production of display devices, while enhancing reliability.

DETAILED DESCRIPTION

In general, according to one embodiment, a method of manufacturing a display device, includes: preparing a first substrate formed such that a first resin layer with an island shape is formed on a first support substrate, and thereafter a display element portion and a mounting portion are formed above the first resin layer and a protection layer, which extends from an end portion of the first resin layer along the mounting portion onto the first support substrate, is disposed; preparing a second substrate formed such that a second resin layer is formed on a second support substrate; attaching the first substrate and the second substrate; peeling the second support substrate from the second resin layer by radiating a laser beam toward the second substrate; mounting a flexible printed circuit board, which is in a state in which the flexible printed circuit board is opposed to the protection layer, on the mounting portion; and peeling the first support substrate from the first resin layer by radiating a laser beam toward the first substrate.

According to another embodiment, a display device includes: an array substrate including a first resin substrate, a display element portion and a mounting portion which are formed above the first resin substrate, and a protection layer which is disposed on an end portion of the first resin substrate along the mounting portion; a counter-substrate including a second resin substrate which is formed in the same shape as the first resin substrate and is opposed to the display element portion and the mounting portion; an adhesive which adheres the display element portion of the array substrate and the counter-substrate; and a flexible printed circuit board mounted on the mounting portion in a state in which the flexible printed circuit board is opposed to the protection layer.

Embodiments will now be described in detail with reference to the accompanying drawings. In the drawings, structural elements having the same or similar functions are denoted by like reference numerals, and an overlapping description is omitted.

Figure 1A:
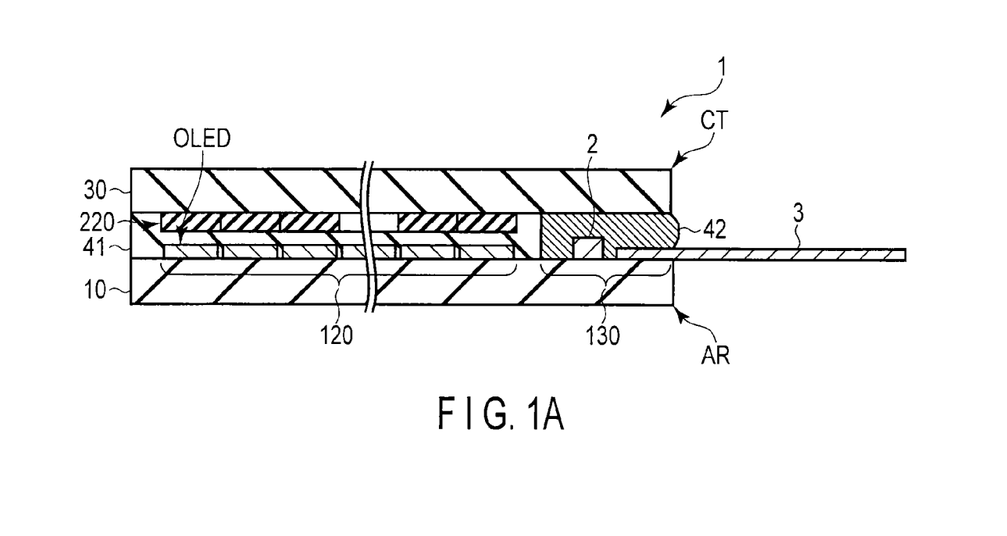
FIG. 1A is a view which schematically illustrates a cross-sectional structure of a display device 1 according to an embodiment.

FIG. 1A is a view which schematically illustrates a cross-sectional structure of a display device 1 according to the embodiment. A description is given of an organic EL display device as an example of a sheet-shaped display device 1.

Specifically, the display device 1 includes an array substrate AR and a counter-substrate CT. The array substrate AR is formed by using a first resin substrate 10. The array substrate AR includes a display element portion 120 and a mounting portion 130, on an inner surface of the first resin substrate 10, that is, on the side thereof facing the counter-substrate CT. The display element portion 120 includes a plurality of organic EL elements OLED. Each organic EL element OLED emits, for example, white light. An IC chip 2 and a flexible printed circuit board 3 are mounted on the mounting portion 130 as signal supply sources which supply necessary signals for driving the organic EL elements OLED.

The counter-substrate CT is formed by using a transparent second resin substrate 30. The second resin substrate 30 is opposed to the display element portion 120 and mounting portion 130. The counter-substrate CT includes a color filter layer 220 on an inner surface of the second resin substrate 30, that is, on the side thereof facing the array substrate AR. The color filter layer 220 is composed of a plurality of kinds of color filters with different colors. The color filter layer 220 is opposed to the display element portion 120, and the color filters of the respective colors are opposed to the organic EL elements OLED.

The array substrate AR and counter-substrate CT are attached by an adhesive 41 and an adhesive 42. The adhesive 41 attaches the display element portion 120 and the counter-substrate CT. In an example, the adhesive 41 attaches the display element portion 120 and the color filter layer 220. In addition, the adhesive 41 also extends to the periphery of the display element portion 120, and attaches the first resin substrate 10 and second resin substrate 30. The adhesive 42 attaches the first resin substrate 10 and second resin substrate 30 in the state in which the signal supply sources (IC chip 2 and flexible printed circuit board 3) are held between the first resin substrate 10 and second resin substrate 30. Each of the adhesive 41 and adhesive 42 is formed of a material with low moisture permeability, and functions as a moisture barrier film or a sealing film.

Figure 1B:
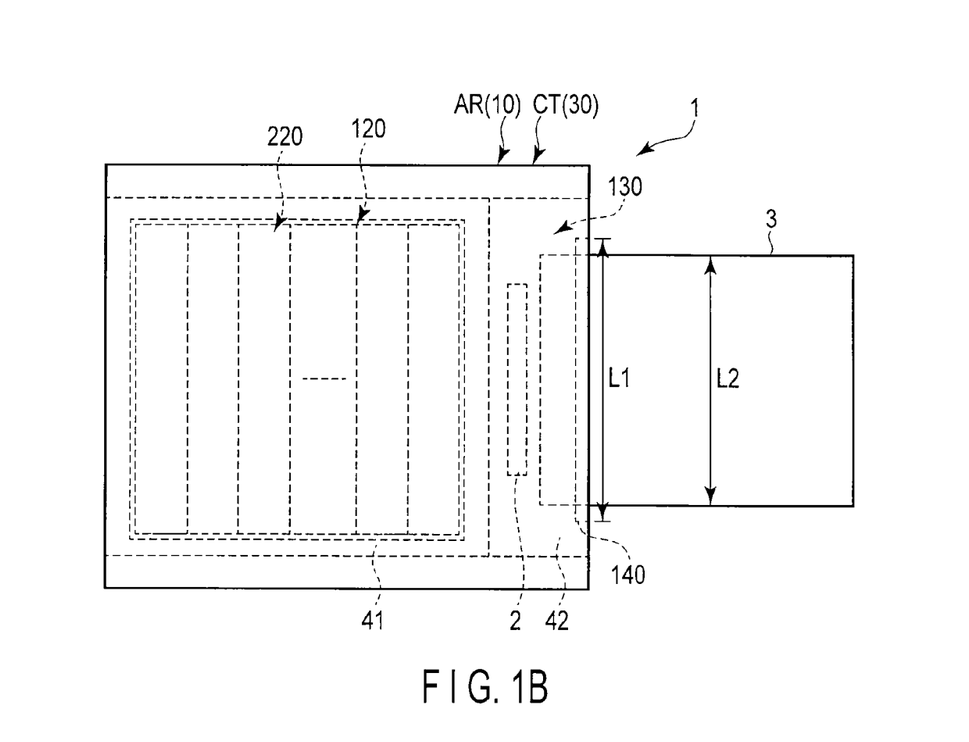
FIG. 1B is a plan view which schematically illustrates the display device 1 shown in FIG. 1A.

FIG. 1B is a plan view which schematically illustrates the display device 1 shown in FIG. 1A.

The array substrate AR and counter-substrate CT have the same outer shape, and have end portions overlapping each other. Specifically, the first resin substrate 10 and second resin substrate 30 are formed in the same shape, and the end portions of the first resin substrate 10 and the end portions of the second resin substrate 30 overlap with each other on the four sides. Although the depiction of the organic EL elements, etc. is omitted, the display element portion 120 is formed in a rectangular shape, and the color filter layer 220 is disposed in a manner to overlap the display element portion 120. The adhesive 41 is disposed not only between the display element portion 120 and the color filter layer 220, but is also disposed in a manner to surround the display element portion 120 and the color filter layer 220.

A protection layer 140 is disposed at one end portion of the first resin substrate 10 along the mounting portion 130. The flexible printed circuit board 3 is mounted on the mounting portion 130 in the state in which the flexible printed circuit board 3 is opposed to the protection layer 140. A length L1 of the protection layer 140, which is disposed at the end portion, is greater than a length L2 in the width direction of the flexible printed circuit board 3. Incidentally, the protection layer 140 does not need to be disposed over the entirety of the end portion, and it should suffice if the protection layer 140 is disposed at least at a position overlapping the flexible printed circuit board 3. In the mounting portion 130, the adhesive 42 is disposed in a manner to cover the area on which the IC chip 2 and flexible printed circuit board 3 are mounted.

Figure 1C:
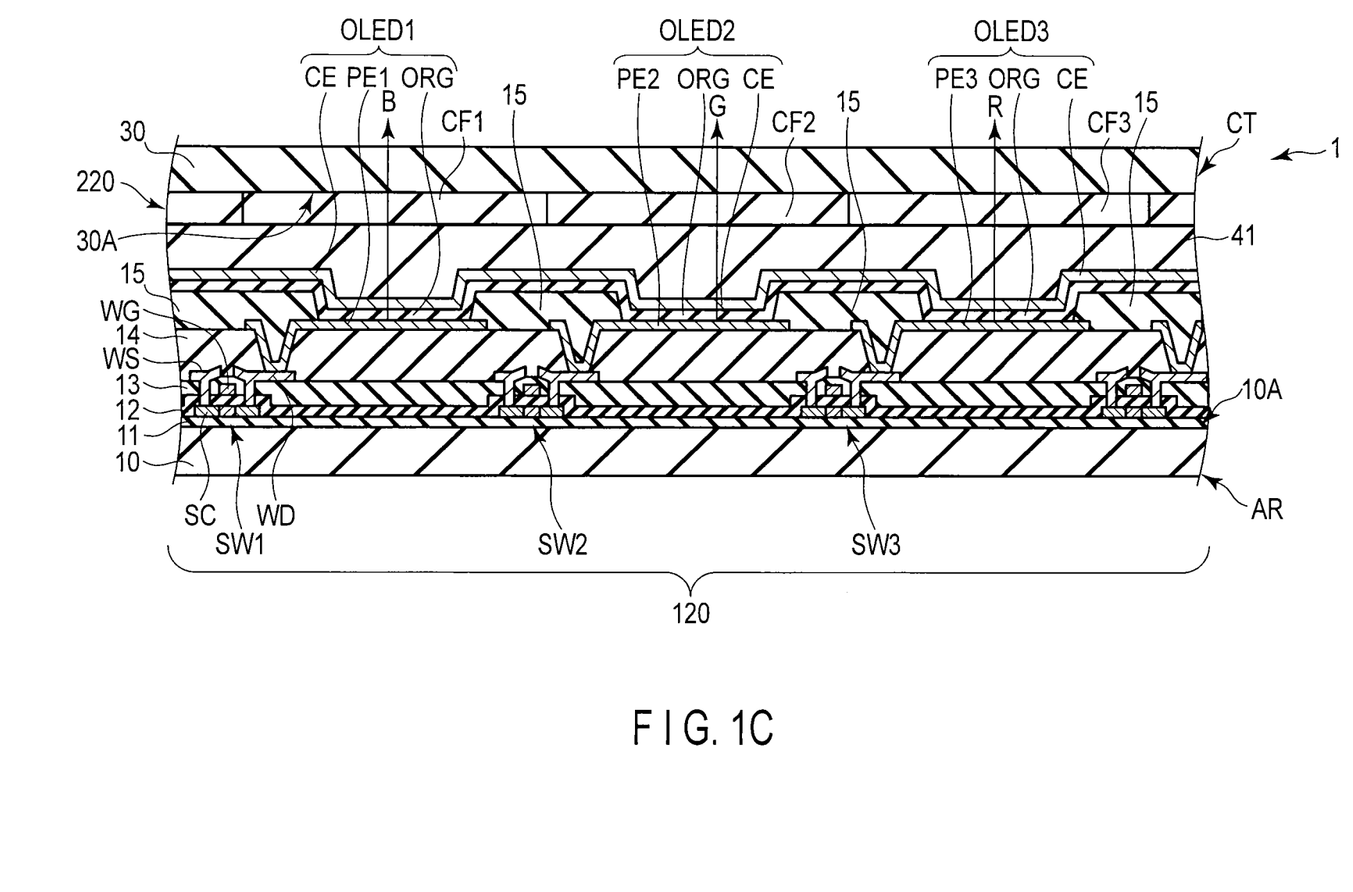
FIG. 1C is a view which schematically illustrates a cross-sectional structure including a display element portion 120 of the display device 1 of the embodiment.

FIG. 1C is a view which schematically illustrates a cross-sectional structure including the display element portion 120 of the display device 1 of the embodiment. A description is given of a cross-sectional structure of the display device 1 of a top emission type.

Specifically, the array substrate AR includes switching elements SW1 to SW3 and organic EL elements OLED1 to OLED3 on an inner surface 10A side of the first resin substrate 10. The inner surface 10A of the first resin substrate 10 is covered with a first insulation film 11. The first insulation film 11 functions as an inner surface barrier film for suppressing entrance of ionic impurities from the first resin substrate 10 or entrance of moisture via the first resin substrate 10. The first insulation film 11 is formed of an inorganic material such as silicon nitride (SiN), silicon oxide (SiO) or silicon oxynitride (SiON), and is composed of a single layer or a multi-layer. Incidentally, when another insulation film, which is located on the inner surface 10A side of the first resin substrate 10, functions as a barrier film, the first insulation film 11 may be omitted.

The switching elements SW1 to SW3 are formed on the first insulation film 11. These switching elements SW1 to SW3 are, for example, thin-film transistors (TFTs) each including a semiconductor layer SC. The switching elements SW1 to SW3 have the same structure. In the description below, attention is paid to the switching element SW1, and the structure thereof is described more specifically.

In the example illustrated, the switching element SW1 is of a top gate type, but may be of a bottom gate type. The semiconductor layer SC is formed of, for example, amorphous silicon, polysilicon, or an oxide semiconductor. Preferably, a silicon-based material with a relatively high absorption ratio for ultraviolet wavelengths should be applied to the semiconductor layer SC. The semiconductor layer SC is formed on the first insulation film 11, and is covered with a second insulation film 12. The second insulation film 12 is also disposed on the first insulation film 11. A gate electrode WG of the switching element SW1 is formed on the second insulation film 12. The gate electrode WG is covered with a third insulation film 13. The third insulation film 13 is also disposed on the second insulation film 12. A source electrode WS and a drain electrode WD of the switching element SW1 are formed on the third insulation film 13. The source electrode WS and drain electrode WD are put in contact with the semiconductor layer SC. The source electrode WS and drain electrode WD are covered with a fourth insulation film 14. The fourth insulation film 14 is also disposed on the third insulation film 13.

The organic EL elements OLED1 to OLED3 are formed on the fourth insulation film 14. In the example illustrated, the organic EL element OLED1 is electrically connected to the switching element SW1, the organic EL element OLED2 is electrically connected to the switching element SW2, and the organic EL element OLED3 is electrically connected to the switching element SW3. Each of the organic EL elements OLED1 to OLED3 is configured as a top emission type which emits white light toward the counter-substrate CT. The organic EL elements OLED1 to OLED3 have the same structure.

The organic EL element OLED1 includes an anode PE1 which is formed on the fourth insulation film 14. The anode PE1 is in contact with the drain electrode WD of the switching element SW1 and is electrically connected to the switching element SW1. Similarly, the organic EL element OLED2 includes an anode PE2 which is electrically connected to the switching element SW2, and the organic EL element OLED3 includes an anode PE3 which is electrically connected to the switching element SW3.

The organic EL elements OLED1 to OLED3 further include an organic light emission layer ORG and a cathode CE. The organic light emission layer ORG is located on the anodes PE1 to PE3. For example, the organic light emission layer ORG is continuously formed, without a break, over the organic EL elements OLED1 to OLED3. The cathode CE is located on the organic light emission layer ORG. The cathode CE is continuously formed, without a break, over the organic EL elements OLED1 to OLED3.

Specifically, the organic EL element OLED1 is composed of the anode PE1, organic light emission layer ORG and cathode CE. Similarly, the organic EL element OLED2 is composed of the anode PE2, organic light emission layer ORG and cathode CE, and the organic EL element OLED3 is composed of the anode PE3, organic light emission layer ORG and cathode CE.

In the meantime, in the organic EL elements OLED1 to OLED3, a hole injection layer or a hole transport layer may be further provided between each of the anodes PE1 to PE3 and the organic light emission layer ORG, and an electron injection layer or an electron transport layer may be further provided between the organic light emission layer ORG and the cathode CE.

In the example illustrated, the organic EL elements OLED1 to OLED3 are partitioned by ribs 15. The ribs 15 are formed on the fourth insulation film 14 and cover the edges of the anodes PE1 to PE3. Although not described in detail, the ribs 15 are formed, for example, in a grid shape or in a stripe shape on the fourth insulation film 14.

Although not illustrated, it is desirable that the organic EL elements OLED1 to OLED3 be sealed by a transparent sealing film. As the sealing film, a single layer or a multilayer of a transparent inorganic material (e.g. silicon nitride, silicon oxide) is applicable, and also a multilayer, which is formed by alternately stacking a thin film of an inorganic material and a thin film of an organic material, is applicable.

The display element portion 120 corresponds to a structure body of a region in which plural switching elements SW and plural organic EL elements OLED are arranged, and is substantially a structure body of a display area which displays an image.

The counter-substrate CT includes a color filter layer 220, etc. on an inner surface 30A side of the second resin substrate 30.

In the present embodiment, the first resin substrate 10 and second resin substrate 30 are formed of, for example, a material consisting mainly of polyimide (PI). Each of the first resin substrate 10 and second resin substrate 30 has a thickness of, e.g. 5 to 30 μm. It is desirable to use, aside from polyimide, a resin material with high heat resistance, such as polyamide imide or polyaramide, as the material of the first resin substrate 10 and second resin substrate 30. In particular, since light emitted from the top-emission type organic EL elements OLED1 to OLED3 passes through the second resin substrate 30, it is desirable that the second resin substrate 30 be formed of a material with high transparency, and be formed of polyimide among the above-mentioned materials.

In the case where one display pixel is composed of sub-pixels of three colors of red, blue and green, the color filter layer 220 includes a color filter CF1, a color filter CF2 and a color filter CF3. The color filter CF1 is a blue color filter which is opposed to the organic EL element OLED1 and passes a light component of a blue wavelength of white light. The color filter CF2 is a green color filter which is opposed to the organic EL element OLED2 and passes a light component of a green wavelength of white light. The color filter CF3 is a red color filter which is opposed to the organic EL element OLED3 and passes a light component of a red wavelength of white light. In the meantime, in the case where one display pixel is composed of sub-pixels of four colors of red, blue, green and white, the color filter layer 220 includes a transparent color filter which is opposed to an organic EL element OLED, in addition to the blue color filter, green color filter and red color filter.

The counter-substrate CT may further include a transparent barrier layer on the inner surface 30A side of the second resin substrate 30, in order to suppress the entrance of ionic impurities from the second resin substrate 30, and the entrance of moisture via the second resin substrate 30.

The display element portion 120 of the array substrate AR and counter-substrate CT are attached by the transparent adhesive 41.

In the display device 1, when each of the organic EL elements OLED1 to OLED3 has emitted light, this radiated light (white light) is emitted to the outside via the color filter CF1, color filter CF2 or color filter CF3. At this time, a light component of a blue wavelength of the white light, which has been radiated from the organic EL element OLED1, passes through the color filter CF1. In addition, a light component of a green wavelength of the white light, which has been radiated from the organic EL element OLED2, passes through the color filter CF2. A light component of a red wavelength of the white light, which has been radiated from the organic EL element OLED3, passes through the color filter CF3. Thereby, color display is realized.

Figure 1D:
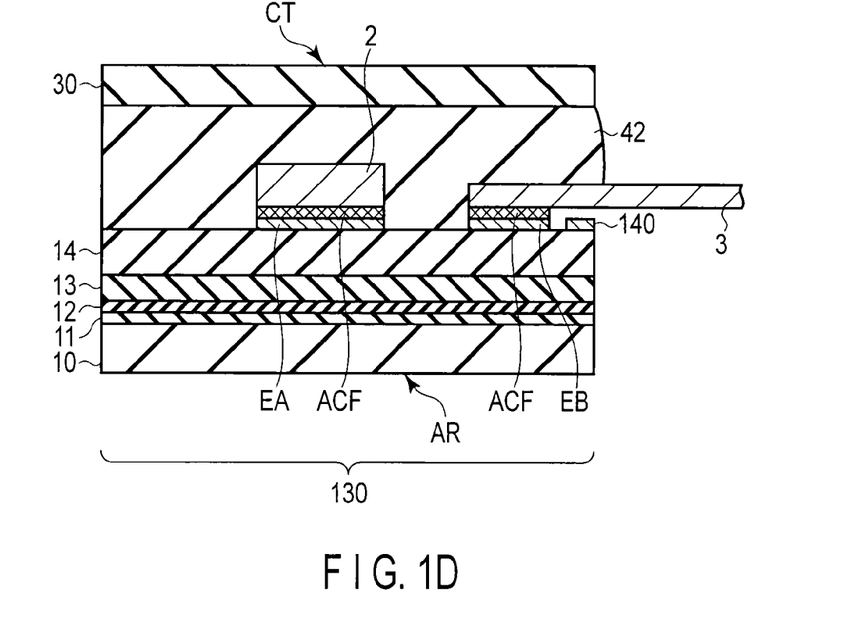
FIG. 1D is a view which schematically illustrates a cross-sectional structure including a mounting portion 130 of the display device 1 of the embodiment.

FIG. 1D is a view which schematically illustrates a cross-sectional structure including the mounting portion 130 of the display device 1 of the embodiment.

In the example illustrated, in the mounting portion 130 of the array substrate AR, the first insulation film 11, second insulation film 12, third insulation film 13 and fourth insulation film 14 are stacked on the first resin substrate 10. In the mounting portion 130, a pad portion EA, on which the IC chip 2 is mounted, and a pad portion EB, on which the flexible printed circuit board 3 is mounted, are provided on the fourth insulation film 14. The pad portion EB is located closer to the end portion side of the array substrate AR than the pad portion EA. The IC chip 2 is mounted on the pad portion EA via an anisotropic conductive film ACF. The flexible printed circuit board 3 is mounted on the pad portion EB via an anisotropic conductive film ACF.

Incidentally, although not illustrated, in the mounting portion 130, various wirings and various circuits, which are formed in the same layer as the gate electrodes, source electrodes and anodes, are formed. The pad portion EA and pad portion EB are electrically connected to these various wirings and circuits.

The protection layer 140 neighbors the pad portion EB and is located at the substrate end portion of the array substrate AR, but is spaced apart from the pad portion EB. This protection layer 140 is formed of a material with a relatively high absorption ratio for ultraviolet wavelengths, and corresponds to an ultraviolet absorption layer. Specifically, the protection layer 140 has a function of protecting the flexible printed circuit board 3 from light with an ultraviolet wavelength which is radiated from the first resin substrate 10 side. In order to achieve this function, a silicon-based material should preferably be applied to the protection layer 140. For example, the protection layer 140 can be formed of the same material as the semiconductor layer SC, which is applied to the switching element. In the example illustrated, the protection layer 140 is disposed on the fourth insulation film 14, like the pad portion EB. Alternatively, the protection layer 140 may be disposed on the first insulation film 11, like the semiconductor layer SC of the switching element. In this case, since the semiconductor layer SC and the protection layer 140 can be formed batchwise in the same fabrication step, another fabrication step for forming the protection layer 140 is needless, and the introduction of a new material can be avoided.

The counter-substrate CT is attached to the mounting portion 130 of the array substrate AR by the adhesive 42.

Next, a description is given of an example of a method of manufacturing the display device 1 according to the embodiment.

Figure 2:
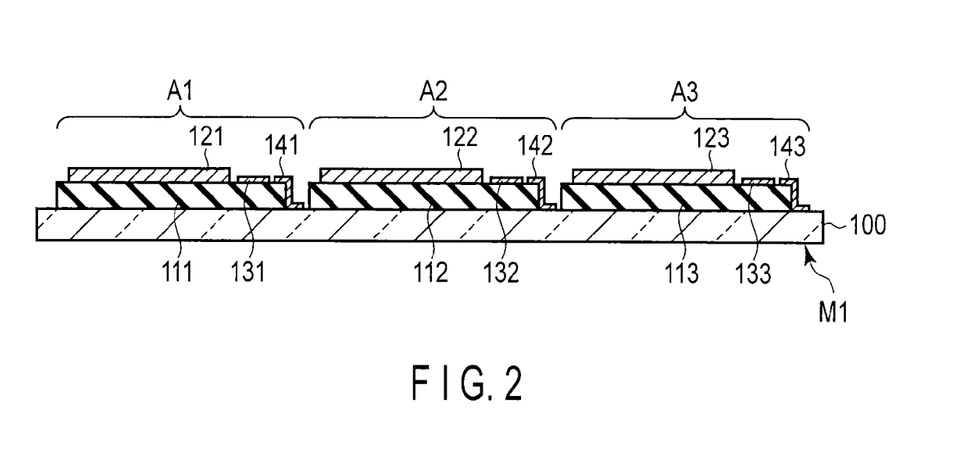
FIG. 2 is a view for describing a method of manufacturing the display device 1 of the embodiment, FIG. 2 illustrating a step of preparing a first mother substrate M1.

To begin with, as illustrated in FIG. 2, a first mother substrate M1 is prepared. Specifically, a film of a polyimide precursor compound with a thickness of 5 to 30 μm is formed on a first support substrate 100 which is formed of no-alkali glass or the like, by using a film-forming device such as a slit coater. Then, this film is cured by heating, and patterned by using a photolithography process. Thereby, first resin layers 111 to 113 are formed. As an example, the thickness of each of the first resin layers 111 to 113 was set at 10 μm. Each of the first resin layers 111 to 113 corresponds to the above-described first resin substrate 10. The first resin layers 111 to 113 are formed in a first region A1, a second region A2 and a third region A3, respectively, and are spaced apart from each other. Specifically, each of the first resin layers 111 to 113 is formed in an island shape on the first support substrate 100. In other words, each of the first resin layers 111 to 113 is patterned to have the same outer shape size as the first resin substrate 10 of the organic EL display device that is a final product.

Then, on the first resin layer 111, a first display element portion 121 and a first mounting portion 131 are formed, and a protection layer 141 is formed. On the second resin layer 112, a second display element portion 122 and a second mounting portion 132 are formed, and a protection layer 142 is formed. On the third resin layer 113, a third display element portion 123 and a third mounting portion 133 are formed, and a protection layer 143 is formed.

The first display element portion 121, second display element portion 122 and third display element portion 123 have the same structure and correspond to the above-described display element portion 120. Although a detailed structure is not illustrated, each of the first display element portion 121, second display element portion 122 and third display element portion 123 includes a plurality of switching elements SW and a plurality of organic EL elements OLED, which are arranged in a matrix. In addition, the first mounting portion 131, second mounting portion 132 and third mounting portion 133 have the same structure and correspond to the above-described mounting portion 130. Although a detailed structure is not illustrated, each of the first mounting portion 131, second mounting portion 132 and third mounting portion 133 includes a pad portion EA and a pad portion EB. The protection layers 141 to 143 have the same shape, and are formed to extend from end portions of the first resin layers 111 to 113 onto the first support substrate 100. A part of each of the protection layers 141 to 143 corresponds to the above-described protection layer 140. The protection layers 141 to 143 are formed, for example, during fabrication steps of forming the first display element portion 121, second display element portion 122 and third display element portion 123 (for example, in a fabrication step of forming the semiconductor layer). For example, the protection layer 140 is a silicon thin film.

Figure 3:
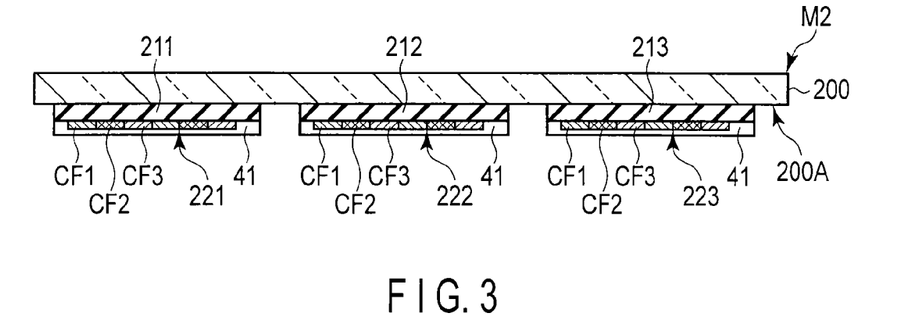
FIG. 3 is a view for describing the method of manufacturing the display device 1 of the embodiment, FIG. 3 illustrating a step of preparing a second mother substrate M2.

Subsequently, as illustrated in FIG. 3, a second mother substrate M2 is prepared. Specifically, transparent second resin layers 211 to 213 are formed on an inner surface 200A of a second support substrate 200 which is formed of no-alkali glass or the like. The method of forming the second resin layers 211 to 213 is the same as that of the first resin layers 111 to 113, and a description thereof is omitted. As an example, the thickness of each of the second resin layers 211 to 213 was set at 10 μm. Each of the second resin layers 211 to 213 corresponds to the above-described second resin substrate 30.

The second resin layer 211 is formed at a position which corresponds to the first region A1 when the first mother substrate M1 and second mother substrate M2 are attached. Similarly, the second resin layer 212 is formed at a position corresponding to the second region A2, and the third resin layer 213 is formed at a position corresponding to the second region A3. These second resin layers 211 to 213 are spaced apart from each other. Specifically, each of the second resin layers 211 to 213 is formed in an island shape on the inner surface 200A of the second support substrate 200. In other words, each of the second resin layers 211 to 213 is patterned to have the same outer-shape size as the second resin substrate 30 of the organic EL display device that is the final product.

Then, a first color filter layer 221 is formed on the second resin layer 211, a second color filter layer 222 is formed on the second resin layer 212, and a third color filter layer 223 is formed on the second resin layer 213. The first color filter layer 221 is formed at such a position as to face the first display element portion 121, when the first mother substrate M1 and second mother substrate M2 are attached. Similarly, the second color filter layer 222 is formed at such a position as to face the second display element portion 122, and the third color filter layer 223 is formed at such a position as to face the third display element portion 123. The first color filter layer 221, second color filter layer 222 and third color filter layer 223 have the same structure, and each of the first color filter layer 221, second color filter layer 222 and third color filter layer 223 includes a first color filter (blue color filter) CF1, a second color filter (green color filter) CF2 and a third color filter (red color filter) CF3.

An adhesive 41 is coated on the surfaces of the first color filter layer 221, second color filter layer 222 and third color filter layer 223.

Figure 4:
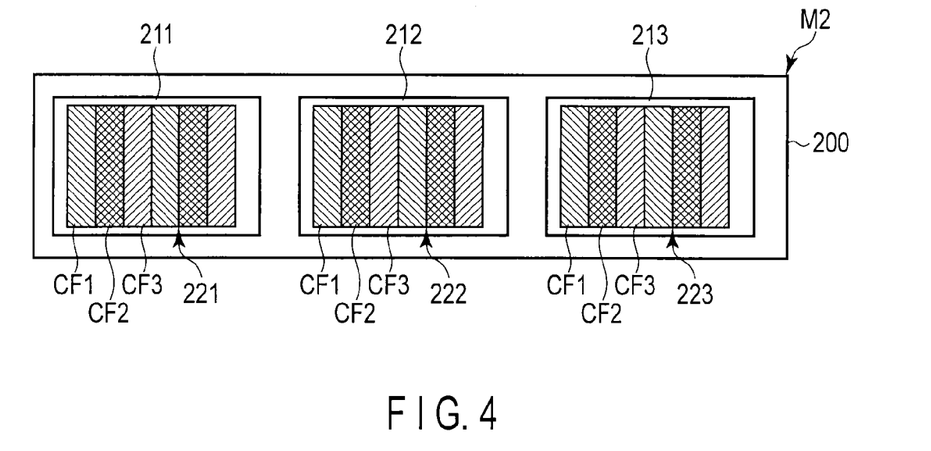
FIG. 4 is a schematic plan view of the second mother substrate M2 shown in FIG. 3.

As illustrated in FIG. 4, each of the first color filter CF1, second color filter CF2 and third color filter CF3 is formed in a stripe shape, and the first color filter CF1, second color filter CF2 and third color filter CF3 are cyclically arranged in the named order.

Figure 5:
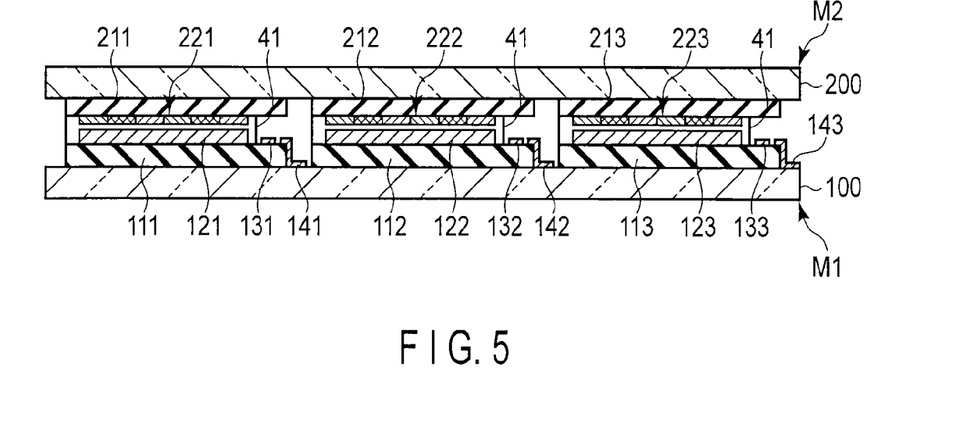
FIG. 5 is a view for describing the method of manufacturing the display device 1 of the embodiment, FIG. 5 illustrating a step of attaching the first mother substrate M1 and the second mother substrate M2.

Subsequently, as illustrated in FIG. 5, the first mother substrate M1 and second mother substrate M2 are attached. Specifically, the first display element portion 121 and first color filter layer 221 are attached by the adhesive 41, the second display element portion 122 and second color filter layer 222 are attached by the adhesive 41, and the third display element portion 123 and third color filter layer 223 are attached by the adhesive 40.

Figure 6:
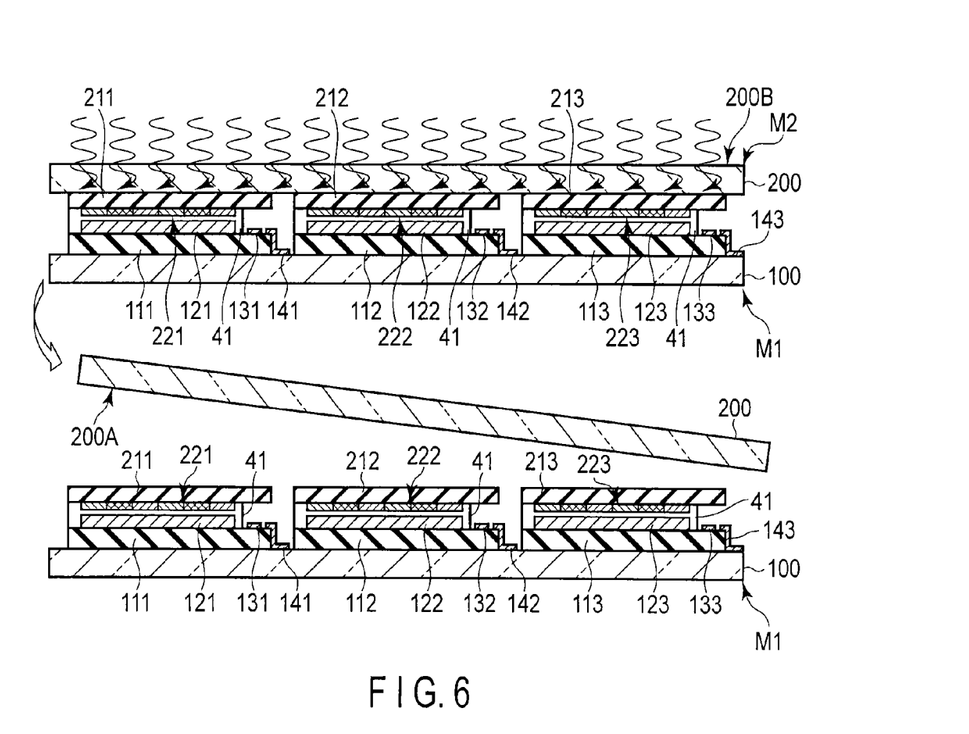
FIG. 6 is a view for describing the method of manufacturing the display device 1 of the embodiment, FIG. 6 illustrating a step of peeling a second support substrate 200 from second resin layers 211 to 213.

Following the above, as illustrated in FIG. 6, as regards the second mother substrate M2, the second support substrate 200 is peeled from the second resin layers 211 to 213, and the second support substrate 200 is removed. Specifically, as regards the second mother substrate M2, a laser beam is radiated on almost the entire surface of the second support substrate 200 from an outer surface 200B side of the second support substrate 200, and ablation is performed. At this time, as the light source of the laser beam that is radiated, use can be made of a light source (laser device) or a heat source (electromagnetic wave radiation device) which exhibits local energy absorption at an interface between the second support substrate 200 and the second resin layers 211 to 213. In this example, an excimer laser device was used. In an example, the oscillation wavelength of the excimer laser device is, e.g. 308 nm.

By the radiation of the laser beam, the laser beam is properly absorbed in the second resin layers 211 to 213, and the absorbed laser beam changes to thermal energy, and parts of the second resin layers 211 to 213 are evaporated in the vicinity of the interface between the second resin layers 211 to 213 and the second support substrate 200. Thus, the second support substrate 200 and the second resin layers 211 to 213 are separated. Thereby, the second resin layers 211 to 213, first color filter layer 221, second color filter layer 222 and third color filter layer 223 are transferred onto the first mother substrate M1. This method is called "laser ablation", etc.

Figure 7:
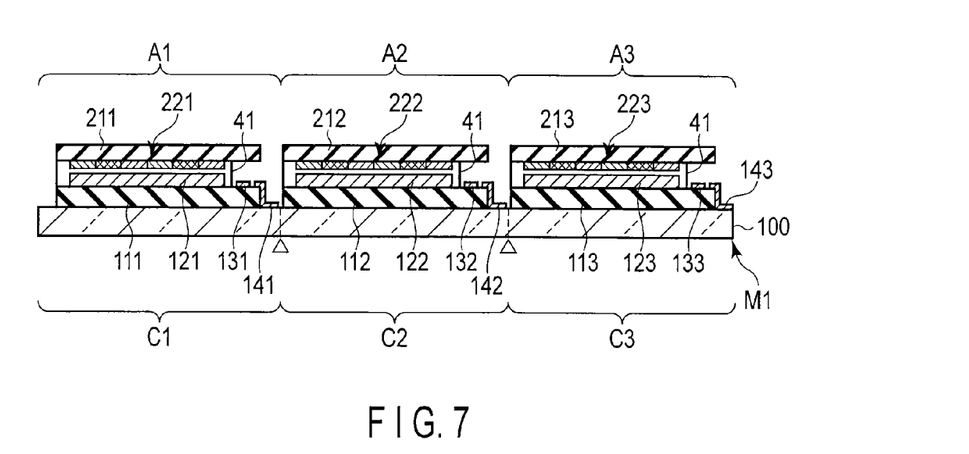
FIG. 7 is a view for describing the method of manufacturing the display device 1 of the embodiment, FIG. 7 illustrating a step of cutting a first support substrate 100.

Thereafter, as illustrated in FIG. 7, the first support substrate 100 is cut by scribing along cut lines indicated by broken lines. Thereby, chips C1 to C3, which are separated from the first mother substrate M1, are obtained. The chip C1 obtained from the first region A1 includes the first display element portion 121 and first mounting portion 131. The chip C2 obtained from the second region A2 includes the second display element portion 122 and second mounting portion 132. The chip C3 obtained from the third region A3 includes the third display element portion 123 and third mounting portion 133.

Figure 8:
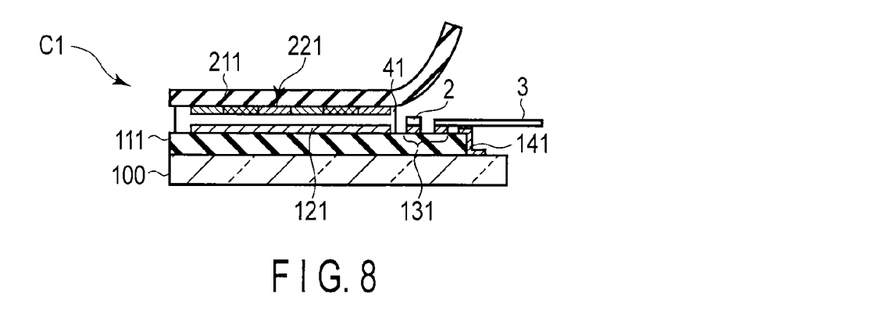
FIG. 8 is a view for describing the method of manufacturing the display device 1 of the embodiment, FIG. 8 illustrating a step of mounting a signal supply source.

Subsequently, as illustrated in FIG. 8, as regards the separated chip C1, the IC chip 2 and flexible printed circuit board 3, which are signal supply sources, are mounted on the first mounting portion 131. At this time, in the state in which the second resin layer 211, which is opposed to the first mounting portion 131, is warped in a direction away from the first mounting portion 131, the IC chip 2 and flexible printed circuit board 3 are mounted on the first mounting portion 131. Since the first support substrate 100 is left as an underlayer of the first resin layer 111, it is possible to secure a sufficient support strength of the first mounting portion 131, against a pressing force which is applied at the time of mounting the IC chip 2 and flexible printed circuit board 3. Although not illustrated, signal supply sources are also mounted on the second mounting portion 132 of the chip C2 and the third mounting portion 133 of the chip C3.

Figure 9:
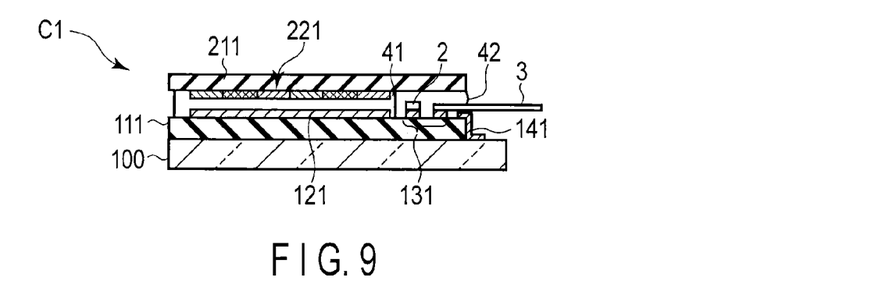
FIG. 9 is a view for describing the method of manufacturing the display device 1 of the embodiment, FIG. 9 illustrating a step of attaching a first resin layer 111 and the second resin layer 211, with the signal supply source being interposed.

Following the above, as illustrated in FIG. 9, in the first mounting portion 131, the first resin layer 111 and second resin layer 211 are attached by an adhesive 42. Thereby, the IC chip 2 and flexible printed circuit board 3, which are mounted on the first mounting portion 131, are held between the first resin layer 111 and second resin layer 211. Although not illustrated, as regards the second mounting portion 132 of the chip C2, the first resin layer 112 and second resin layer 212 are attached by the adhesive 42, and the signal supply sources are held therebetween. Similarly, as regards the third mounting portion 133 of the chip C3, the first resin layer 113 and second resin layer 213 are attached by the adhesive 42, and the signal supply sources are held therebetween.

Figure 10:
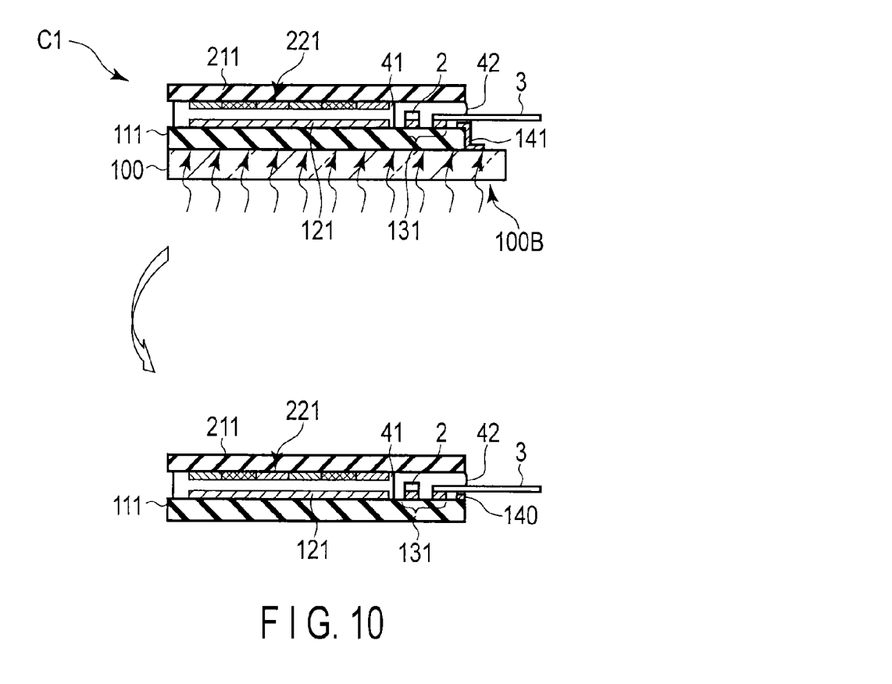
FIG. 10 is a view for describing the method of manufacturing the display device 1 of the embodiment, FIG. 10 illustrating a step of peeling the first support substrate 100 from the first resin layer 111.

Subsequently, as illustrated in FIG. 10, as regards the chip 1, the first support substrate 100 is peeled from the first resin layer 111, and the first support substrate 100 is removed. Specifically, a laser beam is radiated on that area of the first support substrate 100, which overlaps the first resin layer 111, from the outer surface 100B side of the first support substrate 100, and ablation is performed. The laser ablation at this time was conducted under the same condition as described with reference to FIG. 6. As the light source at this time, an excimer laser was used, like the case described with reference to FIG. 6. Although not illustrated, by similar laser ablation, the first support substrate 100 and the first resin layer 112 are separated as regards the chip C2, and the first support substrate 100 and the first resin layer 113 are separated as regards the chip C3.

By the radiation of the laser beam, the laser beam is properly absorbed in the first resin layer 111, and the absorbed laser beam changes to thermal energy, and a part of the first resin layer 111 is evaporated in the vicinity of the interface between the first resin layer 111 and the first support substrate 100. Thus, the first support substrate 100 and the first resin layer 111 are separated. In addition, the area from the end portion of the first resin layer 111, which overlaps the flexible printed circuit board 3, to the first support substrate 100 is covered with the protection layer 141. Thus, even if the laser beam is radiated not only on the area overlapping the first resin layer 111, but also on an area outside this area, the laser beam is absorbed by the protection layer 141. Specifically, the protection layer 141 prevents the laser beam from reaching the flexible printed circuit board 3. Taking into account the precision of radiation of the laser beam, if the protection layer 141 extends on the first support substrate 100 with a width of about 1 mm from the end portion of the first resin layer 111, the protection layer 141 can present the laser beam from reaching the flexible printed circuit board 3.

Thereby, the first support substrate 100 and first resin layer 111 are separated. A part of the protection layer 141 is left on the end portion of the separated first resin layer 111, and the other part of the protection layer 141 is removed together with the first support substrate 100.

Thus, the display device 1 of the embodiment is manufactured.

According to the above-described embodiment, the first mother substrate M1 is applied. This first mother substrate M1 is formed such that the first resin layer 111 is formed on the first support substrate 100, and thereafter the first display element portion 121 and first mounting portion 131 are formed and the protection layer 141, which extends from the end portion of the first resin layer 111 along the first mounting portion 131 onto the first support substrate 100, is disposed. Thereafter, in this first mother substrate M1, the IC chip 2 and flexible printed circuit board 3 are mounted on the first mounting portion 131. At this time, in the state in which the flexible printed circuit board 3 is opposed to the protection layer 141, one end portion of the flexible printed circuit board 3 is mounted on the first mounting portion 131, and the other end portion thereof extends to the outside from the first resin layer 111. Thereafter, the first support substrate 100 is peeled from the first resin layer 111 by radiating a laser beam from the outer surface side of the first support substrate 100. At this time, since the area from the end portion of the first resin layer 111, which overlaps the flexible printed circuit board 3, to the first support substrate 100 is covered with the protection layer 141, the laser beam, which is radiated on the outside of the end portion of the first resin layer 111, is absorbed by the protection layer 141. It is thus possible to prevent the laser beam from being directly radiated on the flexible printed circuit board 3 projecting outward from the end portion of the first resin layer 111, and to protect the flexible printed circuit board 3 from the laser beam for peeling the first support substrate 100.

Accordingly, when display devices are mass-produced, the flexible printed circuit board 3 can surely be mounted. When the laser beam is subsequently radiated in order to peel the first support substrate 100 from the first resin layer 111, it is possible to avoid damage to the flexible printed circuit board 3, regardless of the precision of radiation position of the laser beam, and to improve the productivity and improve the reliability of the device.

According to the present embodiment, the protection layer 141 can be formed of a silicon-based material. In this case, when the switching element including the semiconductor layer SC is formed in the first display element portion 121, the protection layer 141 can be formed of the same material at the same time as the semiconductor layer SC. Thus, another fabrication step for forming the protection layer 141 is needless, and the introduction of a new material for forming the protection layer 141 is not required. Therefore, an increase in manufacturing cost can be suppressed. Incidentally, in the case where the protection layer 141 was formed of a silicon-based material, the protection layer 141 is formed of amorphous silicon or polysilicon.

Furthermore, according to the embodiment, the second mother substrate M2 is applicable, in which the second resin layers 211 to 213, which are formed in the same island shape as the first resin layers 111 to 113, are formed on the inner surface 200A of the second support substrate 200. Thus, fabrication steps for individually cutting the first resin layers 111 to 113 and the second resin layers 211 to 213 are needless. Therefore, an increase in manufacturing cost can be suppressed.

In addition, according to the present embodiment, after the signal supply sources are mounted, the second resin layer 211, which is opposed to the mounting portion 131, is adhered to the first resin layer 111. Thus, the signal supply sources are held between the first resin layer 111 and second resin layers 211. Therefore, separation of the signal supply sources from the first mounting portion 131 can be suppressed, and the strength of mounting can be improved. In addition, in the first mounting portion 131, since the adhesive 42, which adheres the first resin layer 111 and second resin layer 211, has low moisture permeability, the entrance of moisture via the adhesive 42 can be suppressed, and the damage to the signal supply sources due to moisture can be reduced. Therefore, the reliability can be enhanced.

Besides, according to the embodiment, since the display device 1 is configured such that the first resin substrate 10 and second resin substrate 30 are applied, compared to a display device in which glass substrates are applied, the thickness and weight can be reduced, flexibility is high, and the degree of freedom in shaping is high. In addition, since each of the first resin substrate 10 and second resin substrate 30 has a moisture barrier layer on the inner surface thereof, the entrance of moisture via the first resin substrate 10 and second resin substrate 30 can be suppressed. Thus, the damage due to moisture to the organic EL elements OLED1 to OLED3 can be reduced. Therefore, degradation in display quality due to occurrence of dark spots can be suppressed.

In the above-described embodiment, each of the second resin layers 211, second resin layer 212 and second resin layer 213 is formed in the island shape. Alternatively, these resin layers may be formed as a single resin layer, and the single resin layer may be cut after the second support substrate 200 is separated.

In the above example, the description has been given of the display device in which the counter-substrate CT includes the color filter layer 220, and the manufacturing method of the display device in which the color filter layer 220 is formed on the counter-substrate CT. However, the embodiment is not limited to this example. For instance, the array substrate AR may include the color filter layer 220.

Figure 11:
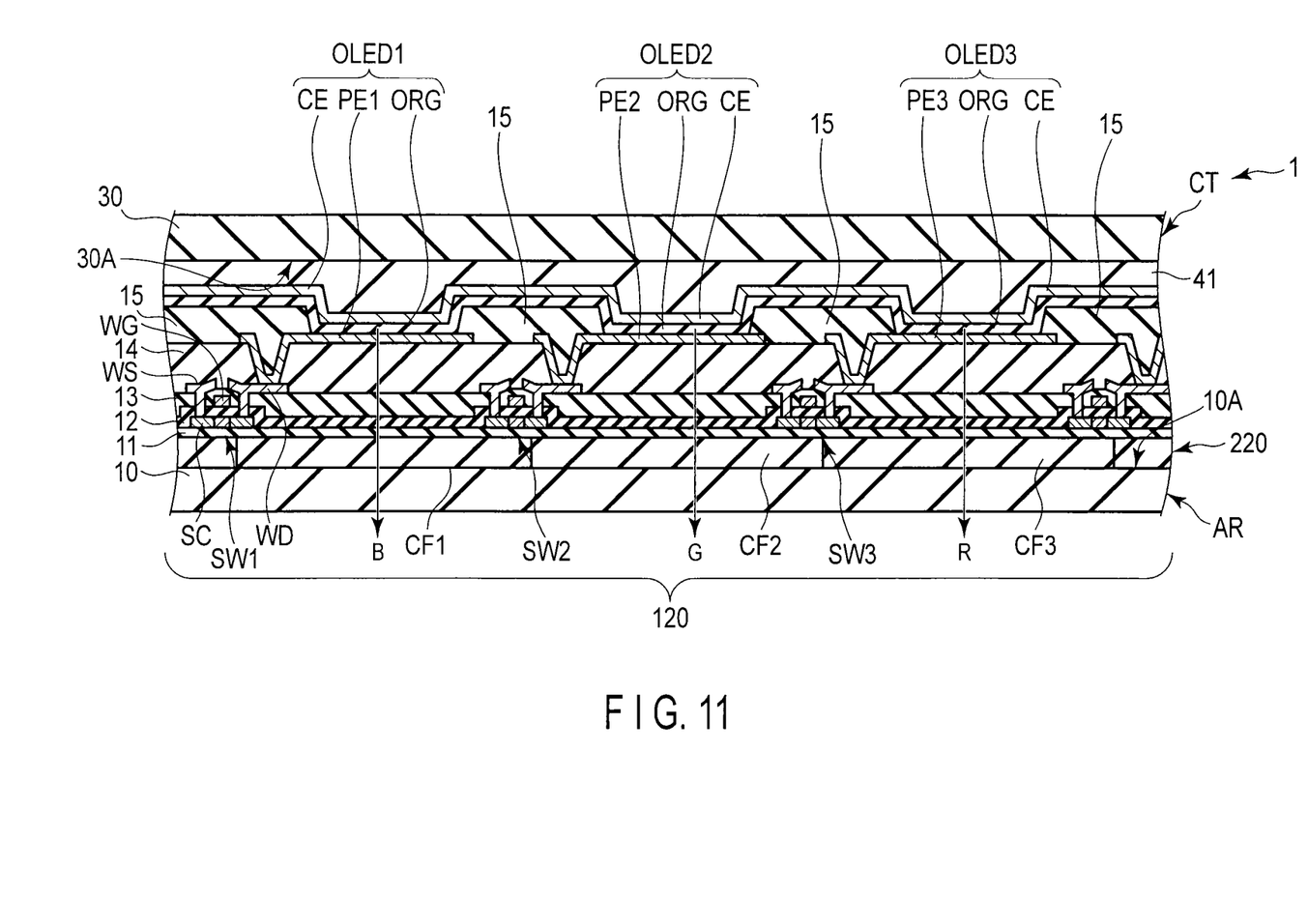
FIG. 11 is a view which schematically illustrates another cross-sectional structure including the display element portion 120 of the display device 1 of the embodiment.

FIG. 11 is a view which schematically illustrates another cross-sectional structure including the display element portion 120 of the display device 1 of the embodiment.

The example illustrated relates to a bottom-emission-type display device 1. Specifically, the display device 1 illustrated in FIG. 11 differs from the display device 1 described with reference to FIG. 1C in that the color filter layer 220 is disposed on the inner surface 10A of the first resin substrate 10, and that each of the organic EL elements OLED1 to OLED3 is configured as a bottom emission type which emits white light toward the first resin substrate 10. The color filter layer 220 is disposed between the first resin substrate 10 and the first insulation film 11. In the example illustrated, the color filter CF1 is located between the organic EL element OLED1 and the first resin substrate 10, the color filter CF2 is located between the organic EL element OLED2 and the first resin substrate 10, and the color filter CF3 is located between the organic EL element OLED3 and the first resin substrate 10.

Figure 12:
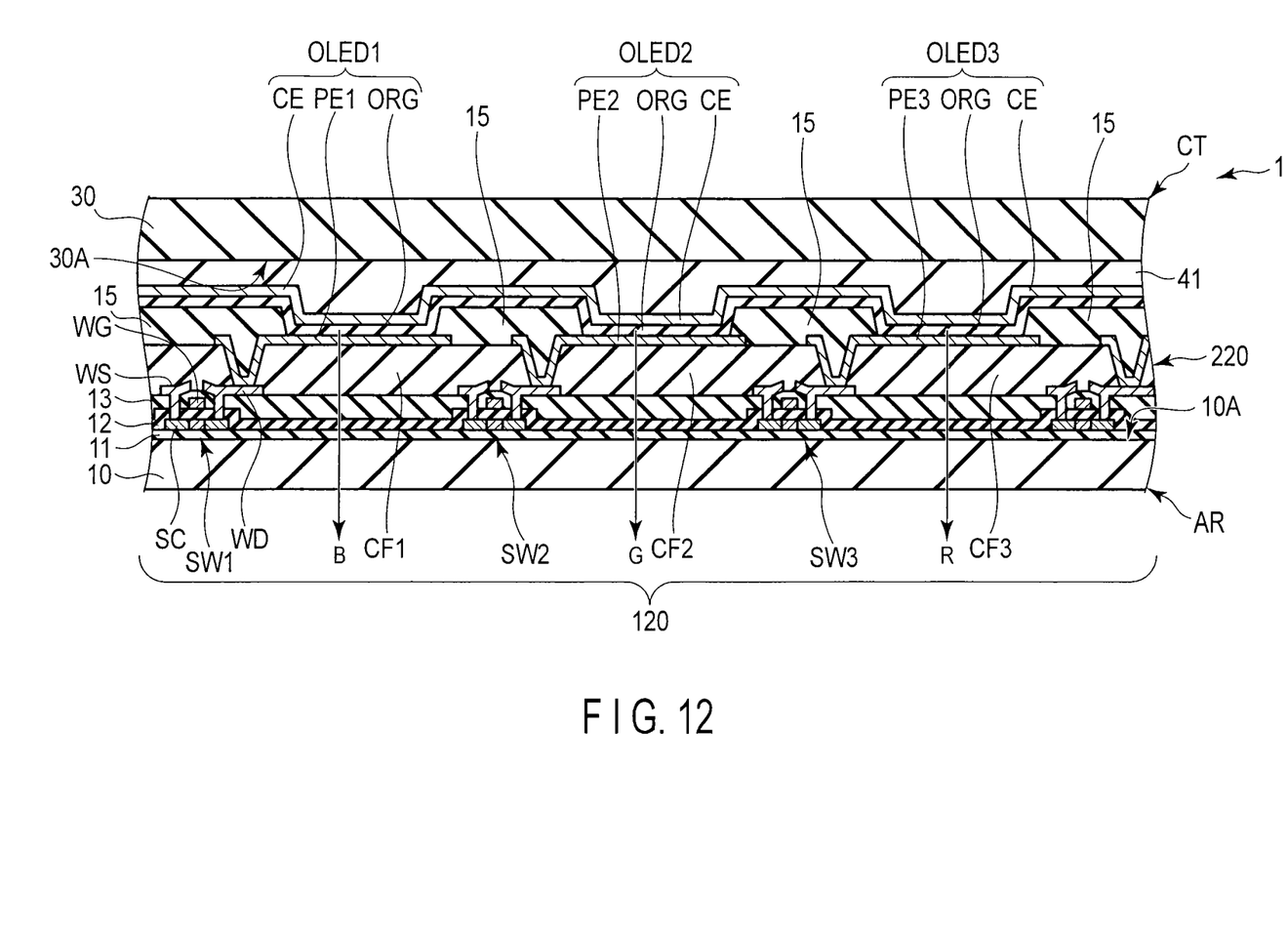
FIG. 12 is a view which schematically illustrates another cross-sectional structure including the display element portion 120 of the display device 1 of the embodiment.

FIG. 12 is a view which schematically illustrates another cross-sectional structure including the display element portion 120 of the display device 1 of the embodiment.

The display device 1 of the bottom emission type illustrated in FIG. 12 differs from the display device 1 illustrated in FIG. 11 in that the color filter layer 220 is substituted for the fourth insulation film 14. The color filter layer 220 is disposed between the third insulation film 13 and the organic EL elements OLED1 to OLED3. In the example illustrated, the color filter CF1 is located between the organic EL element OLED1 and the third insulation film 13, the color filter CF2 is located between the organic EL element OLED2 and the third insulation film 13, and the color filter CF3 is located between the organic EL element OLED3 and the third insulation film 13. Incidentally, the color filter layer 220 may be substituted for an insulation film other than the fourth insulation film 14.

The method of manufacturing the above-described bottom-emission-type display devices 1 is the same as in the above-described example, except for the step of preparing the first mother substrate M1 illustrated in FIG. 2, and the step of preparing the second mother substrate M2 illustrated in FIG. 3.

Figure 13:
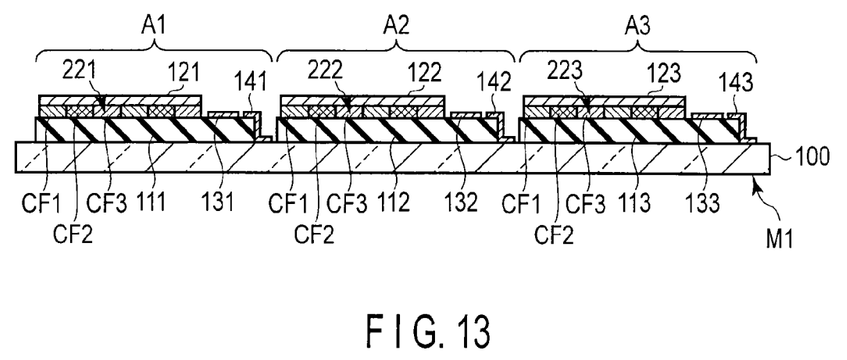
FIG. 13 is a view for describing a method of manufacturing the display device 1 of the embodiment, FIG. 13 illustrating another step of preparing the first mother substrate M1.

FIG. 13 is a view for describing a method of manufacturing the display device 1 of the embodiment, FIG. 13 illustrating another step of preparing the first mother substrate M1.

Specifically, first resin layers 111 to 113 are formed on a first support substrate 100 which is formed of no-alkali glass or the like. Then, a first color filter layer 221, a second color filter layer 222 and a third color filter layer 223 are formed on the first resin layers 111 to 113. Thereafter, a first display element portion 121 and a first mounting portion 131 are formed in the first region A1, a second display element portion 122 and a second mounting portion 132 are formed in the second region A2, and a third display element portion 123 and a third mounting portion 133 are formed in the third region A3. At this time, the first display element portion 121 is formed at a position overlapping the first color filter layer 221, the second display element portion 122 is formed at a position overlapping the second color filter layer 222, and third display element portion 123 is formed at a position overlapping the third color filter layer 223.

On the other hand, in the step of preparing the second mother substrate M2, transparent second resin layers 211 to 213 are formed on the inner surface 200A of the second support substrate 200.

The subsequent fabrication steps are the same as those in the above-described example, and a description thereof is omitted.

With this bottom-emission-type display device and the manufacturing method thereof, the same advantageous effects as with the above-described example of the top emission type can be obtained.

As has been described above, according to the present embodiment, there can be provided a display device which can improve the productivity and reliability, and a manufacturing method thereof.

In the meantime, in the above-described embodiment, as an example of the display device, the organic EL display device has been described. However, another example of the display device may be a liquid crystal display device. In this case, the display element portion is configured to include a pixel electrode in place of the anode, which is connected to a switching element, a common electrode in place of the cathode, and a liquid crystal layer including liquid crystal molecules in place of the organic light emission layer. Light, which passes through the liquid crystal layer, is modulated by switching the liquid crystal molecules by an electric field between the pixel electrode and common electrode. Use may be made of a method in which a closed-loop-shaped sealant is used in place of the adhesive 41, and a liquid crystal material is dispensed in the inside surrounded by the sealant before the first mother substrate M1 and second mother substrate M2 are attached. Incidentally, the color filter layer may be provided on the array substrate or may be provided on the counter-substrate.

In the embodiment, the above-described laser ablation technique is applied to the peeling between the first support substrate 100 and the first resin layers 111 to 113, and the peeling between the second support substrate 200 and the second resin layers 211 to 213. Alternatively, other techniques, such as a thermal rapid anneal technique, are applicable.

As regards the second mother substrate M2, each of the second resin layers 211 to 213 is formed in the island shape. Alternatively, a second resin layer, which continuously extends, without a break, over the inner surface 200A of the second support substrate 200, may be formed, and this second resin layer may be cut into a desired size by radiating a laser beam to the second resin layer, after peeling the second support substrate 200 from the second mother substrate M2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a display device, comprising:
    preparing a first substrate formed such that a first resin layer with an island shape is formed on a first support substrate;
    forming a display element portion, a mounting portion, and a protection layer above the first resin layer, the protection layer extending from an end portion of the first resin layer along a long side of the mounting portion onto the first support substrate;
    preparing a second substrate formed such that a second resin layer is formed on a second support substrate;
    attaching the first substrate and the second substrate;
    peeling the second support substrate from the second resin layer by radiating a laser beam toward the second substrate;
    mounting a flexible printed circuit board, which is in a state in which the flexible printed circuit board is opposed to the protection layer, on the mounting portion; and
    peeling the first support substrate from the first resin layer by radiating a laser beam toward the first substrate.

2. The method of claim 1, wherein, in said preparing the first substrate, a switching element including a semiconductor layer is formed in the display element portion, and the protection layer is formed of the same material as the semiconductor layer.

3. The method of claim 1, further comprising forming a color filter layer, which is opposed to the display element portion, above the first resin layer or above the second resin layer, before attaching the first substrate and the second substrate.

4. The method of claim 1, wherein, in said preparing the second substrate, the second resin layer with an island shape corresponding to the island shape of the first resin layer is formed.

5. The method of claim 1, further comprising adhering the first resin layer and the second resin layer in a state in which the flexible printed circuit board is held between the first resin layer and the second resin layer.

6. A display device comprising:
    an array substrate including a first resin substrate, a display element portion, and a mounting portion which are formed above the first resin substrate, the display element portion including a plurality of thin film transistors and a plurality of organic emitting elements;
    a counter-substrate including a second resin substrate which is formed in the same shape as the first resin substrate and is opposed to the display element portion and the mounting portion;
    a first adhesive which adheres the display element portion of the array substrate and the counter-substrate;
    a second adhesive which adheres the mounting portion of the array substrate and the counter-substrate;
    a flexible printed circuit board mounted on the mounting portion, and arranged between the second adhesive and the mounting portion, and
    a protection layer formed on an end portion of the first resin substrate along a long side of the mounting portion,
    wherein the array substrate, the protection layer, the flexible printed circuit board, the second adhesive, and the counter-substrate are arranged in this order,
    the mounting portion includes a pad portion, on which the flexible printed circuit board is mounted, and
    the protection layer is located closer to the end portion side of the first resin substrate than the pad portion.

7. The display device of claim 6, wherein the display element portion includes a switching element including a semiconductor layer, and
    the protection layer is formed of the same material as the semiconductor layer.

8. The display device of claim 6, further comprising a color filter layer, which is opposed to the display element portion, between the first resin substrate and the second resin substrate.

9. The display device of claim 6, wherein a width of the protection layer is greater than a width of the flexible printed circuit board in a direction along the long side of the mounting portion.

10. The display device of claim 9, wherein a predetermined empty space is arranged between the protection layer and the flexible printed circuit board.

* * * * *